(12) United States Patent
Brailove

(10) Patent No.: US 7,976,629 B2
(45) Date of Patent: Jul. 12, 2011

(54) CRYSTAL FILM FABRICATION

(76) Inventor: Adam Alexander Brailove, San Jose, CA (US)

( * ) Notice: Subject to any disclaimer, the term of this patent is extended or adjusted under 35 U.S.C. 154(b) by 762 days.

(21) Appl. No.: 12/033,011

(22) Filed: Feb. 18, 2008

(65) Prior Publication Data

US 2009/0170298 A1    Jul. 2, 2009

Related U.S. Application Data

(60) Provisional application No. 61/018,483, filed on Jan. 1, 2008.

(51) Int. Cl.
  *C30B 15/00* (2006.01)
(52) U.S. Cl. .............. 117/26; 257/E21.568; 117/915; 117/922; 438/433
(58) Field of Classification Search ........... 117/915, 117/26, 47, 922; 257/E21.568; 438/433
See application file for complete search history.

(56) References Cited

U.S. PATENT DOCUMENTS

| 4,309,239 | A | * | 1/1982 | Rodot nee Fumeton | 117/15 |
| 6,059,877 | A | * | 5/2000 | Bruel | 117/35 |
| 2002/0157791 | A1 | * | 10/2002 | Yanagita et al. | 156/344 |
| 2004/0055634 | A1 | * | 3/2004 | Yamaguchi | 136/252 |
| 2007/0004169 | A1 | * | 1/2007 | Endo et al. | 438/433 |

* cited by examiner

*Primary Examiner* — Michael Kornakov
*Assistant Examiner* — Irina Kalish

(57) ABSTRACT

Processes and machines for producing large area sheets or films of crystalline, polycrystalline, or amorphous material are set forth; the production of such sheets being valuable for the manufacturing of solar photovoltaic cells, flat panel displays and the like. The surface of rotating cylindrical workpiece (10) is implanted with ion beam (30), whereby a layer of weakened material is formed below the surface. Sheet (20) is detached and peeled off, producing arbitrarily large, monolithic sheets. The sheet may be supported on a temporary or permanent handle (50) such as a glass sheet or a polymer film. Pinch roller (60) may assist in the lamination of handle (50) to sheet (20) before or after the point of separation of sheet (20) from workpiece (10). The implantation, annealing and separation processes are adapted to encourage the material to separate along the implanted layer rather than a particular crystal plane.

23 Claims, 2 Drawing Sheets

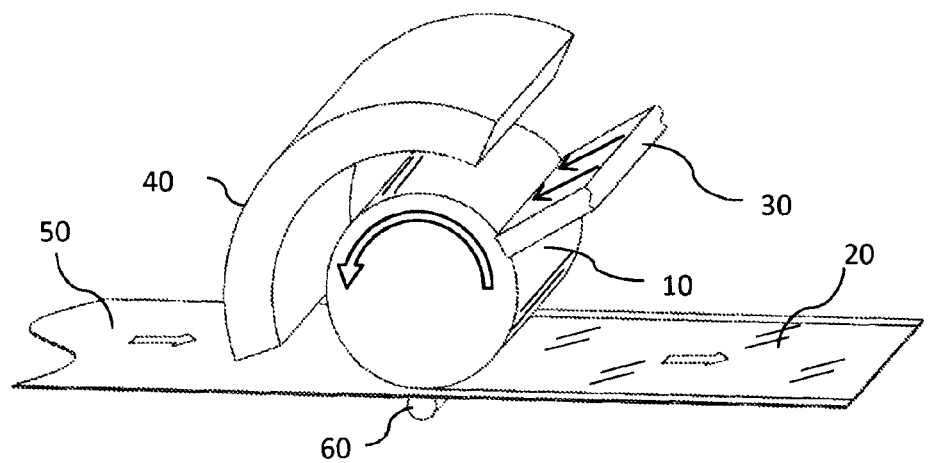
*Fig. 1*
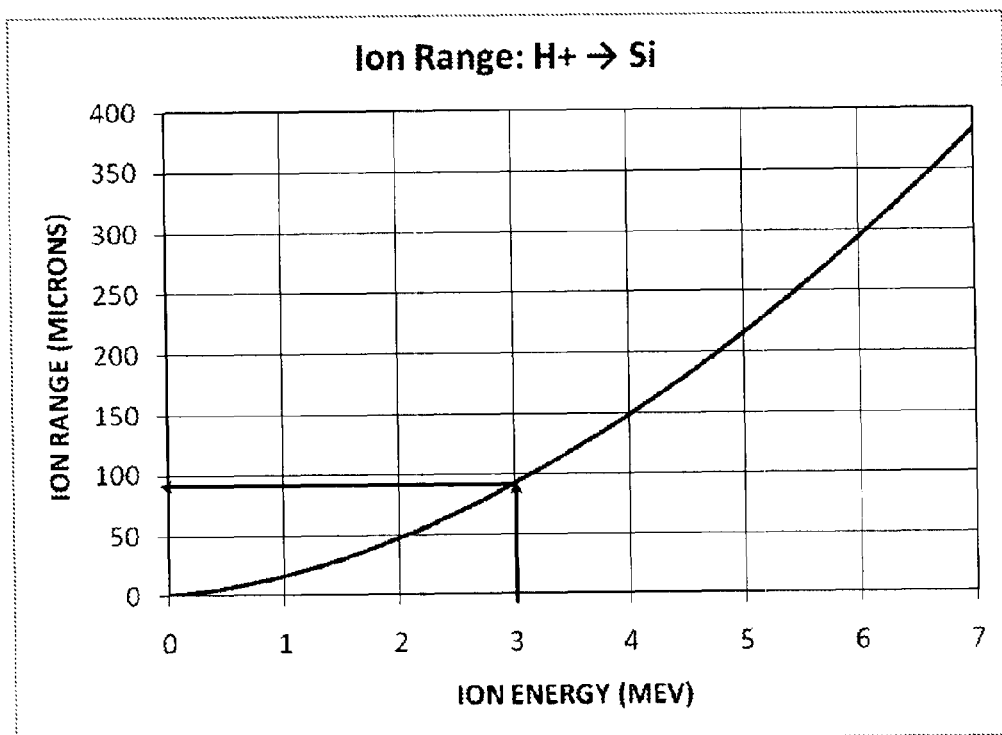
*Fig. 2*     -- Prior Art --

CRYSTAL FILM FABRICATION

CROSS-REFERENCE TO RELATED APPLICATIONS

This application claims the benefit of provisional patent application No. 61/018,483 filed 1 Jan. 2008 by the present inventor.

FEDERALLY SPONSORED RESEARCH

Not applicable

SEQUENCE LISTING OR PROGRAM

Not applicable

FIELD OF THE INVENTION

This invention relates generally to processes, equipment, and techniques for the fabrication of thin films, foils, or sheets of crystalline material. More particularly, this invention relates to methods of economically fabricating large continuous areas of such films, with broad applicability to diverse fields such as microelectronics, flat panel display, and solar photovoltaics.

BACKGROUND OF THE INVENTION

Microelectronic devices are generally fabricated on the surface of slices or wafers of single-crystal (mono-crystalline) silicon. These wafers are sliced from long cylindrical ingots of single-crystal silicon (c-Si) known as boules, which take their cylindrical shape from the way the crystal is grown and drawn from a silicon melt. The wafers sliced from the boule are consequently thin discs of nearly perfectly ordered crystalline material and are cut so that the surface is parallel to one of the primary crystallographic planes. While it is generally straightforward to pull a longer boule from the melt, increasing the diameter of the boule while maintaining the quality of the crystal is a challenging technological feat. Nevertheless, over the decades of development of the microelectronics industry, wafer diameters have gradually increased, driven by improved crystal pulling technology and pressure to reduce costs by packing more chips on each substrate. Wafer sizes have evolved through the following widely used diameters: 24.5 mm, 50 mm, 76 mm, 100 mm, 125 mm, 150 mm, 200 mm, and currently 300 mm.

While modern microelectronic circuits such as microprocessors depend critically on the nearly perfect structure of the crystal lattice for their high speed transistors, other applications of silicon-based electronics such as flat panel displays and solar photovoltaics have emerged, which can tolerate a tradeoff: poorer material properties, such as lower charge carrier mobility, in favor of other desirable features such as lower cost, larger size, and optical transparency.

Flat Panel Displays

In the field of flat panel displays, such as LCDs for example, the electronic backplane that switches the pixels of the display has generally been built starting from a thin film of disordered amorphous silicon (a-Si) deposited onto a glass substrate. The performance of an a-Si transistor is quite poor compared to that of c-Si, however, it is possible to deposit a-Si over large areas of low-cost glass economically, and the thin film of a-Si can be transparent to light, making the a-Si transistor acceptable in many flat panel display applications.

Intermediate in performance between a-Si transistors and c-Si transistors are transistors fabricated from poly-silicon (p-Si), a material which is a agglomeration of tiny crystalline grains each having crystalline order internally, but being oriented randomly with respect to each other.

Demand for displays that are thinner, lighter, faster, and brighter has led to the development of higher performance p-Si transistors fabricated on low-cost glass substrates. Poly-silicon deposition, however, normally requires process temperatures that are higher than the softening temperature of display glass. This limitation was overcome by using an excimer laser beam scanned over an a-Si film thereby recrystallizing a-Si into p-Si. The laser's energy is deposited mainly into the thin film on the surface, with minimal heating of the underlying glass. While this approach has had some success in the marketplace, the recrystallization process is difficult and expensive and still does not produce transistors with the performance of c-Si.

Solar Photovoltaics

A similar set of tradeoffs exist in the solar photovoltaic field. Solar cells fabricated from sliced c-Si or p-Si boules have the higher efficiencies for converting sunlight into electrical energy but they have the attendant difficulties of slicing up the boule, the wasted material associated with the sawing process, and the expensive handling, tiling and connecting of large numbers of slices together into solar arrays. For example, four sides of a cylindrical silicon boule are generally sawn off. This is so that when the slices are tiled together in an array, they fit together well and capture most of the sunlight striking the solar panel. However this trimming often does not completely cut the circular boule down to square cross-section, but rather leaves a square with rounded corners in order to reduce the quantity of trimmed material. The resulting corner area where four slices in an array meet does not collect sunlight, resulting in reduced efficiency.

On the other hand, monolithic solar cells may also be fabricated by depositing a-Si on large sheets of low-cost glass with little material waste, but their inherent light-to-electricity conversion efficiency is relatively low as a result of the poorer properties of the a-Si material.

Ion-Cut Process

Another semiconductor manufacturing process that is widely known is the ion-cut process. This process involves directing an ion beam, generally hydrogen or helium ions, at a crystalline substrate such as a silicon wafer and implanting the ions beneath the surface. The ions come to rest in a thin layer below the surface, the depth of which is dependent on the initial mass and energy of the ions. The depth can be reliably predicted using well-known theories of charged particle interactions with matter. The widely used TRIM or SRIM software code is often used to perform these calculations. FIG. 2 shows data from SRIM relating the penetration depth (known as 'projected range') of hydrogen ions into silicon as a function of incident ion energy. For example, hydrogen ions impinging on silicon at 3 MeV will stop at a depth of approximately 92 micrometers below the surface, in the range of typical thickness for crystalline solar cell fabrication. In general, ion-cut process energies can range from tens of keV for very thin bonded layers, up to arbitrarily high energies for thick, self-supporting slices.

The resulting subsurface damage layer is concentrated around the depth where the ions stop and it weakens the crystal structure at that depth. Subsequent heating of the substrate may also serve to consolidate the implanted gas and nucleate and grow micro-bubbles, further weakening the crystal lattice. Given a sufficient dose of implanted ions and the appropriate application of heat or other source of stress to initiate cleavage, the crystal can be induced to cleave along the plane of the implanted layer. The prior art has involved the formation of damage layer coincident with a single crystal plane, hence the appropriateness of the word 'cleave'

By bonding a so-called 'handle' substrate to the top surface of the implanted 'donor' substrate prior to the cleavage step, it is possible to produce a wide variety of novel composite materials composed of a film of donor material attached to a thicker substrate of handle material. The use of this process to combine otherwise incompatible materials into novel composites is widely known in the art, as are a variety of bonding techniques. The most important application of this process has been to silicon-on-insulator materials which have found wide commercial acceptance.

The potential for the use of the ion-cut process in solar cell manufacture is described in the technical literature, for example: "Crystalline thin-film silicon solar cells from layer-transfer processes: a review", R. Brendel, Proc. 10th Workshop on Crystalline Silicon Solar Cell Materials and Processes, Aug. 13-16, 2000, Copper Mountain, USA, B. L. Sopori,ed. Thin films which are bonded to a thicker substrate such as glass for mechanical support are possible, as are thicker slices which are mechanically self-supporting. The advantage of ion-cut over conventional c-Si or p-Si slices cut from billets by wire-saw, is that the slices can be cut as thin as desired with minimal wasted material due to the thickness of the cutting tool (kerf loss). Nevertheless, the cost and complexity of handling and assembly of numerous slices still exists, as does the efficiency loss due to corner radii.

Similarly, in the field of flat panel display manufacture, U.S. Pat. No. 6,818,529 by Bachrach et al. proposed using the ion-cut process to produce large area film of c-Si by tiling a plurality of thin c-Si polygons across a glass sheet. The boule from which the silicon is sliced is pre-cut to a polygonal cross section to allow the slices to fit neatly together, and the bonding step occurs prior to the cleaving so that the silicon film is always supported. The inevitable gaps between tiles are said to be filled with deposited silicon, annealed and planarized. The degree of commercial success of this process is not known to the present applicant, however the difficulty and cost of manufacture is apparent: aligning, bonding and cleaving multiple separate billets as well as inhomogeneities in film properties between the tiles.

It is evident from these examples, although not limited to them, that it would be highly useful and advantageous to have a means for producing large continuous areas of mono-crystalline silicon films.

OBJECT OF THE INVENTION

Accordingly, it is a general object of this invention to provide an apparatus and methods for producing high quality mono-crystalline or poly-crystalline films, sheets or foils. Another object of this invention is to provide a means of economically producing such films in large, continuous areas suitable for use in large area applications such as flat panel displays and solar photovoltaic devices. Another object of this invention is to provide a means of producing a flat panel display backplane formed preferably from a single, mono-lithic, high performance crystalline film of size substantially larger than the size achievable from standard silicon wafers. Another object of this invention is to provide a means of producing a solar photovoltaic device based on high-efficiency mono-crystalline or poly-crystalline silicon sheets having a size much larger and more economical than those produced by conventional wire saw slicing or ion-slicing of boules or ingots. Another object of this invention is to provide a means for roll-to-roll fabrication of semiconductor devices

SUMMARY OF THE INVENTION

This invention achieves the objectives listed above and others that will become apparent, by starting with a substantially cylindrical boule or ingot of stock material and removing a thin layer of material of the desired thickness from the curved cylindrical surface. In one embodiment, a long sheet is peeled off and 'unrolled' continuously from the approximately cylindrical surface of the stock material in a manner analogous to pulling tape from a roll. In this way, the resulting sheet of high quality material may have a width as large as the length of the boule, and a length many times larger than the diameter of the boule. For example, a silicon sheet 100 microns thick (suitable for photovoltaic cells) and nearly 100 meters long can be produced and it would consume only the outer 11 mm of a 300 mm diameter boule.

In the preferred embodiment, the peeling is accomplished by separating the desired layer of material from the stock material using an ion-cut process wherein an ion beam is directed toward the curved surface of the stock material as the stock is rotated under the ion beam.

This novel method of manufacture is highly advantageous because i) it is possible to cover large rectangular areas with high quality crystalline material and because ii) the 'unrolling' technique is suited to highly economical and efficient continuous roll-to-roll manufacturing methods that can be applied to the film in subsequent processing steps.

BRIEF DESCRIPTION OF THE DRAWINGS

FIG. 1 is an isometric view of an ion-cut embodiment of the invention, shown in simplified form.

FIG. 2 is a plot of proton (hydrogen ion) range in silicon as a function of energy, from SRIM.

Figure 3:
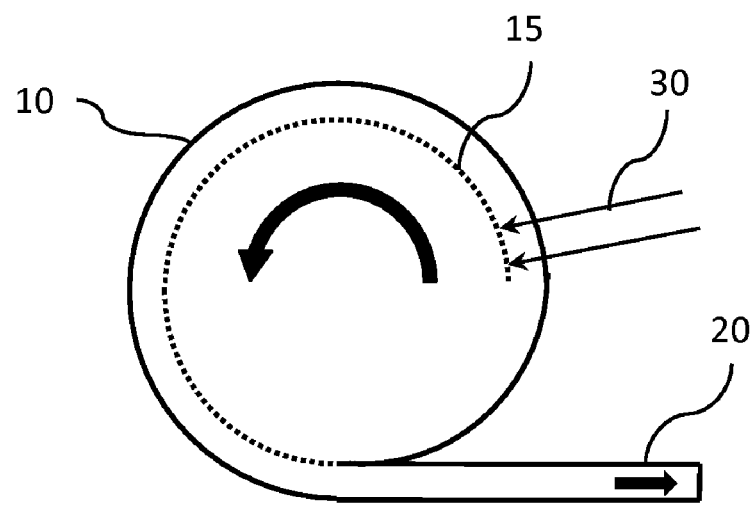
FIG. 3 is a conceptual view of an ion-cut embodiment indicating the separation layer.

DRAWING REFERENCE NUMERALS 10 workpiece (also referred to a boule)
15 separation layer
20 film (also referred to as sheet)
30 ion beam
40 heater
50 handle
60 pinch roller
70 wire saw wire
80 wire saw pulley

DETAILED DESCRIPTION OF THE INVENTION

FIG. 1 shows conceptually a preferred embodiment of the invention which uses the ion-cut technique. A substantially cylindrical boule of mono-crystalline silicon (c-Si) 10, or alternately poly-crystalline silicon (p-Si) or other non-silicon crystalline material is provided. It is preferably mounted on bearings and motor-driven so as to rotate about its cylindrical axis, as indicated by the arrow, although the details of the mounting and driving mechanisms are omitted for clarity.

A ribbon shaped ion beam 30 impinges on the curved surface of the cylindrical boule. The ions would be produced by an ion accelerator or ion implanter, the details of which are not shown for clarity, but for which a large body of prior art exists. The impingement area of the ion beam preferably extends over the full axial length of the boule but may be shorter if narrower strips of crystalline material are desired. A substantially parallel ribbon-shaped beam may be produced in various ways, including providing a static ribbon-shaped ion beam, or alternately, providing a narrower pencil-shaped beam that is scanned rapidly back and forth along the length of the boule by magnetic or electrostatic means. Yet another embodiment could have the boule itself moving back and forth axially so as to paint a static pencil-shaped ion beam across its surface. One of these techniques, in combination with the aforementioned rotation of the boule about its axis provides full treatment of the cylindrical surface by the ion beam.

As mentioned earlier, the depth of penetration of the ions is determined by the ion energy, mass and the target material according to well-known theories of charged particle interactions with matter. There is always some spread in the depth of ions, nevertheless, the ion energy is chosen to produce an ion damage layer centered about a preselected mean depth. The resulting film thickness will correspond closely to the mean depth. Generally hydrogen ions (protons) or helium ions are used in the ion-cut process due to their low mass which results in the deepest possible penetration for a given energy. It is possible to produce films that range in thickness from 300 microns to fractions of 1 micron, although thin films must be supported by a handle. Hydrogen and helium have the further advantage that they are gaseous elements which can be annealed out of the crystal lattice to form micro-bubbles at high temperatures. Helium, moreover, is inert and will not chemically interact with target material.

The required dose of ions generally is between $1\times10^{16}$ ions/cm$^2$ and $5\times10^{17}$ ions/cm$^2$ although larger or smaller doses are possible. Given an available beam current from the ion implanter, the angular rotation speed of the boule is set accordingly to yield a particular desired dose. Specifically, for a given dose, D, boule radius r, and linear beam current density J (in Amps per unit length, axially), the angular velocity c) (in radians per second) of the boule is:

$$\omega: \frac{J}{q_e D r},$$

where $q_e$ is the ion charge. As a boule is 'unwound', the radius r will gradually decrease. It is apparent from this equation that the angular velocity must proportionately be increased or the beam current must be decreased in order to maintain constant dose.

After passing under the ion beam, the rotation of the boule causes the ion-implanted material to pass under one or more optional heaters 40 which heat the surface of the boule. The heat treatment serves several different functions: 1) it anneals out damage to the crystal lattice in the bulk of the film caused by passage of ions improving the quality of the film; 2) it anneals away some of the lattice damage just above and below the main damage layer thereby improving the surface quality of the bottom of the film and the top of the remaining bulk material; 3) it promotes nucleation and growth of gaseous micro-bubbles which assists separation along the implanted region and 4) it produces a thermo-mechanical stress thereby promoting separation of the crystal film. Which of these effects predominates depends on the temperature, time and rate of change of temperature. The heater assembly 40 is sized and electronically controlled in order to provide a predetermined time-temperature profile at the boule surface. Closed-loop temperature control via non-contact temperature measurement of the surface (such as infrared thermometer) is highly desirable.

The crystal lattice separates along the implanted damage region, also referred to herein with the more general term 'separation layer', thereby forming a separate film 20 which is 'unrolled' continuously from the boule and is paid out, or drawn out, as shown by the arrow. An optional 'handle' 50 (shown conceptually) may be provided to support and strengthen the crystal film. The handle 50 may be a flexible film or foil such as glass, metal or plastic. It may be bonded permanently or temporarily to crystal film 20 using any of a wide variety of bonding techniques known in the art. Handle 50 is shown being laminated (in a conceptual form) to film 20 via pinch roller 60. Alternately, the crystal film may be bonded permanently or temporarily to a rigid sheet such as a glass sheet. In still another embodiment, the crystal film may be sufficiently thick to permit subsequent processing operations on the film without requiring a supporting handle.

FIG. 3 shows a schematic view of the boule or workpiece 10 including the subsurface separation layer 15 produced by ion beam 30. To illustrate the implanted layer and the spiral nature of the process, the thickness of sheet 20 and the depth of the implanted layer, which would generally be less than a few hundred micrometers, are highly exaggerated in the figure compared to the diameter of boule 10, which would normally be of the order of centimeters.

The resulting sheet or film of material will have a natural tendency to curl. A supportive backing or handle is also useful in keeping the film flat. In order to prevent cracking of the film when flattened and to minimize film stress due to flattening, the boule radius, r, should satisfy the equation $$r > \frac{t}{2}\frac{E}{\sigma}$$

where t is the film thickness, E is the modulus of elasticity of the material, and σ is the tensile strength of the material. Due to the brittle nature of materials such as silicon, r should generally exceed the quantity on the right hand side of the equation by a substantial factor of safety, such as 10×.

Another advantage of applying a handle, whether permanent or temporary, is that tension may be applied to the handle to assist in smooth, continuous separation or delamination of the film from the boule. This requires that the handle be attached at a point prior to the line where the film separates from the boule. Alternately, various forms of energy may be applied to the boule at this line to induce separation of the film from the bulk. This could take the form of a mechanical stressor such as roller similar to the pinch roller 60, or a thermal stressor such as a ribbon shaped laser beam, or fluid or gas pressure directed at the gap (not shown)

An alternate embodiment (not illustrated) may include heat treatment of the crystalline film 20 after it has been released from the boule where there is more physical space to place heaters and wherein the thin film, having little mass and therefore little heat capacity may be heated and cooled rapidly without unwanted heating or cooling to the bulk of the boule itself.

It is often necessary to perform the implant at a temperature below some maximum temperature so as to limit the diffusion of the implanted ion species out of the crystal lattice prior to separating the film from the underlying crystal substrate. Generally the maximum allowable temperature is less than 500 C and may be less than 350 C in some cases. Cooling of the boule may be necessary if the heat input by the energetic ion beam 30 and the heater assembly 40 causes the maximum allowable implant temperature to be exceeded. One means of cooling the boule (not shown in the figures) would be to bore a cooling channel along the axis of the boule itself. A coolant such as water circulated through this channel would be able to efficiently remove heat due to the direct contact between the coolant and the heated boule. Furthermore the need for an inefficient thermal coupling material interposed between the boule and a coolant conduit would be eliminated. The coolant can be supplied and returned via rotary union, thereby allowing the boule to rotate. The rotating portion of the coolant supply and return conduits would be sealed directly to the boule itself. The coolant could be fed in one end of the boule and out the other. Alternately, the hole in the boule could be a blind hole wherein the coolant is fed to the closed end by a 'squirt tube' and returned coaxially out the open end thereby reducing the number of exposed seals.

One of the central features of the present invention is that the film is 'separated' from the bulk material on a surface that cuts across a huge number of different crystal planes, rather than 'cleaving' the material along substantially one crystal plane. Cleaving involves cooperation between the damage layer and the tendency for cracks in crystals, once initiated, to propagate preferentially along natural crystal planes. In the prior art, the damage surface is a plane that is parallel with essentially a single crystal plane, whereas in this invention the damage surface is disjoint with every crystal planes. In the case of a boule having its axis perpendicular to the (100) crystal plane, for example, the peeled film will separate along each of four {100} planes during each full revolution of the boule. Similarly, separation along {110} planes will also occur four times per revolution but will be shifted by 45 degrees relative to the {100} planes. Mathematically, an almost infinite number of higher order planes will also be sampled as material is removed during one revolution of the boule.

The separation surface may induced to follow the curved layer of implant damage and implanted atoms, rather than progressing along a single natural crystal plane by sufficiently large implant doses and sufficient annealing to minimize the likelihood of a long fracture along a primary crystallographic plane which would result in the breakage of an otherwise long strip of film. In certain cases it may be advantageous to modulate the process parameters such as dose and temperature as a function of angle (corresponding to the crystal plane being implanted for example) to suppress unwanted fracture along certain lower energy crystallographic planes.

Additionally, the crystal plane that is parallel to the surface of the resulting film will vary periodically along the length of the film. This stripe-wise variation in crystallographic axes may result in transistor or material performance parameters such as carrier mobility that vary correspondingly. Such variations, should they be significant to the end product, could be compensated for by in the fabrication or post-fabrication tuning of the devices wherein process or tuning parameters would be spatially modulated along the length of the film in accordance with the primary crystal orientation at each point. Such tuning may be useful in large area displays for example, where spatial variations across the display are readily visible.

Some key elements of the invention are illustrated in FIG. 1. A real-world embodiment of such a device would include many features not shown in the figure. In particular there would be mechanisms for transporting, tensioning, laminating, heat treating, flattening, re-rolling and monitoring the film. In addition, there may be numerous other process steps, depending on the final application, which might be advantageously appended to the film formation step disclosed here in order to get the full economic benefit of roll-to-roll processing.

It is clear that under continuous operation the ion-cut surface will trace out a spiral path through the boule. It is a linear spiral in the sense that since the film thickness is constant, the spiral radius is proportional to the total accumulated boule angle. If the outer surface of the boule is initially perfectly cylindrical then it is apparent that initiating the peeling process poses a problem, since the spiral surface will never coincide perfectly with a cylindrical surface. Simply running a nominal the ion-cut process will produce a step at the starting point that gets replicated every revolution. This difficulty may be resolved by gradually increasing the ion energy to produce a film that smoothly grows in thickness up to the desired thickness, the lead-in portion be discarded later. Alternately, the boule may be pre-shaped, by grinding for example, to have the required initial cross sectional shape of a spiral.

It should be noted that the production and transport of ion beams, except for very high energy beams, can generally only be done in a high vacuum environment: less than 0.1 Pa and preferably less than 0.001 Pa. The annealing and laminating and other process steps described herein may be performed at atmospheric pressure or an intermediate pressure. It is possible to isolate the vacuum portion of the process from the non-vacuum processes using light seals that conform to the rotating surface of the boule. The seals can even be non-contacting in certain circumstances providing only plurality of restrictions to gas flow. The technique of differential pumping would be used to scavenge gas between the restrictions and maintain vacuum isolation.

Figure 4:
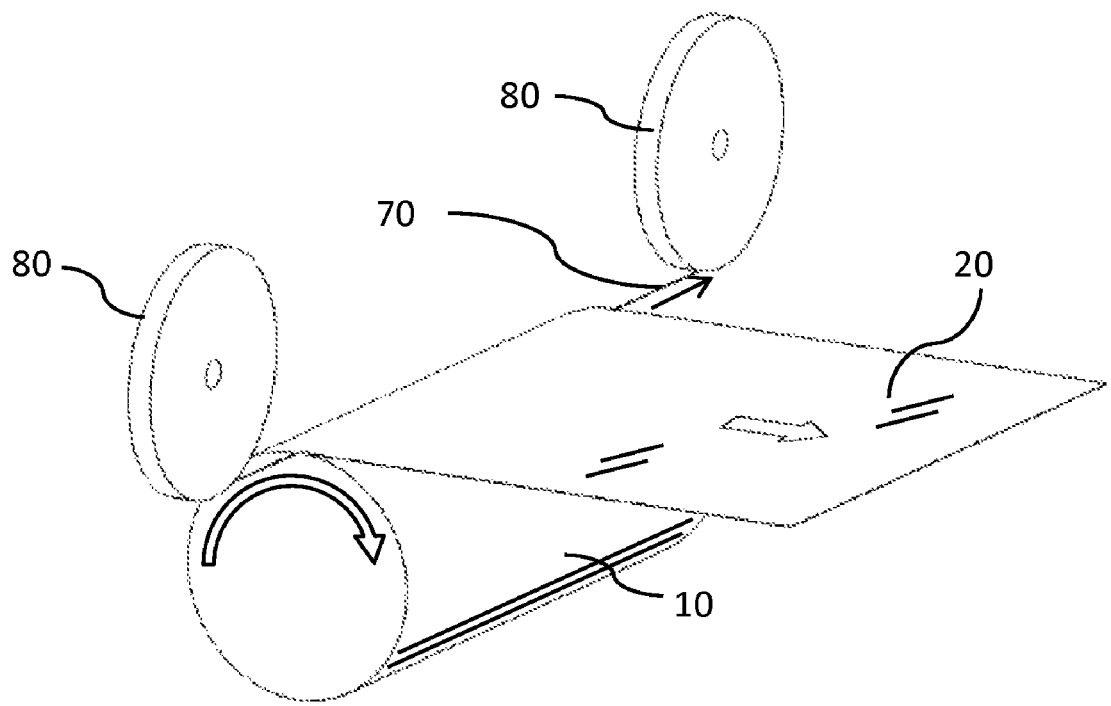
FIG. 4 is an isometric view of a wire-saw embodiment of the invention, shown in simplified form.

FIG. 4 shows conceptually an alternate embodiment of the invention using a wire saw to remove the desired sheet of material for the boule. A wire saw includes a thin, tensioned wire passed through a series of pulleys 80. A straight segment of the wire 70, disposed with abrasive slurry is advanced into the boule 10 being cut. In the embodiment shown, the rotation of the boule 10 advances the material forward into the wire, while a slower advancement of the wire down into the boule produces the required spiral cut allowing thin crystal film 20 to be drawn off the boule 10 in the direction indicated by the arrow. The figure is highly simplified relative to a realistic wire saw to illustrate the novel elements of the concept.

In the preceding detailed description and figures, the invention is described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

I claim:

1. A method for preparing a sheet of material comprising:
    a. providing a substantially cylindrical workpiece, having a substantially cylindrical outer surface,
    b. directing an ion beam of preselected energy toward said outer surface,
    c. rotating said workpiece about its cylindrical axis, whereby said outer surface is progressively exposed to said ion beam, whereby ions are implanted through said outer surface to a depth under said outer surface, thereby defining a separation layer under said outer surface,
    d. progressively drawing off a sheet of material from the periphery of said workpiece, said sheet separating from said workpiece along said separation layer.

2. The method of claim 1 wherein said sheet is peeled continuously from said workpiece whereby the length of said sheet may exceed the circumference of said workpiece.

3. The method of claim 1 wherein the ratio of the thickness of said sheet, to the diameter of said workpiece is less than the ratio of the tensile strength of said material to the elastic modulus of said material, whereby said sheet will not break when flattened.

4. The method of claim 1 further comprising annealing said sheet whereby ion damage to the surface region of said sheet will be reduced.

5. The method of claim 1 wherein said workpiece is crystalline and wherein the tensile strength of said separation layer is lower than the lowest tensile strength of the unimplanted workpiece along any crystal axis, whereby sheet separation occurs preferentially along said separation layer and cleavage of said workpiece along any single natural crystal plane is suppressed.

6. The method of claim 1 wherein said ions are selected from the group consisting of hydrogen ions and helium ions.

7. The method of claim 1 wherein said workpiece is crystalline or polycrystalline silicon.

8. The method of claim 1 further comprising:
   a. providing a handle comprising a substantially planar portion of material distinct from said workpiece,
   b. bonding said handle to said outer surface of said workpiece at a location past where said outer surface has been exposed to said ion beam,
   c. drawing off said handle together with said sheet,
whereby said sheet is mechanically supported and protected by said handle.

9. The method of claim 8 wherein said handle is flexible, whereby it may be dispensed and taken up on rollers.

10. The method of claim 8 wherein said handle is rigid, said handle being bonded to said outer surface substantially at the point where said sheet separates tangentially from said workpiece.

11. The method of claim 8 wherein a force is applied to said handle, said force urging said sheet to peel away from said workpiece along said separation layer.

12. The method of claim 8 wherein said handle is selected from the group consisting of glass, polymer, and metal.

13. The method of claim 8 wherein the adhesion of said handle to said sheet is weak, whereby the bond is temporary, permitting said sheet to be later separated from said handle.

14. The method of claim 1 further comprising heating at least a portion of said workpiece whereby said separation layer is further weakened by the formation of gaseous microbubbles of the implanted specie.

15. The method of claim 1 further comprising heating at least a portion of said workpiece whereby a thermally induced stress is imposed upon said separation layer, whereby said sheet is urged to separate from said workpiece.

16. The method of claim 1 further comprising providing a roller adapted to apply mechanical pressure to the outer surface of said workpiece whereby mechanical stress is imposed upon said separation layer, whereby said sheet is urged to separate from said workpiece.

17. The method of claim 1 wherein said sheet is induced to separate from said workpiece by means other than applying tension to said sheet, whereby said step of progressively drawing off a sheet of material applies substantially no tension to said sheet.

18. The method of claim 1 further comprising doping said sheet with an impurity.

19. The method of claim 1 wherein, at the start of the process, the energy of said ion beam is gradually increased up to said preselected energy while said workpiece is rotating, whereby the depth of ion implantation will correspondingly increase, thereby providing a smoothly tapered entry cut into the workpiece.

20. The method of claim 1 wherein said ion beam is scanned axially over said outer surface, whereby an ion beam of narrow cross sectional dimension may be uniformly spread over the full axial length of said workpiece.

21. The method of claim 1 further comprising:
   a. providing at least one conduit through said workpiece,
   b. controlling the temperature of the internal surface of said conduit,
whereby the temperature of the outer implanted workpiece material is controlled.

22. A method for preparing a sheet of crystalline or polycrystalline material comprising:
   a. providing a workpiece of crystalline or polycrystalline material having a generalized cylindrical surface defined by sweeping a smooth, closed, curve in a plane along an axis perpendicular to said plane,
   b. rotating said workpiece axially,
   c. directing ions of preselected energy toward said generalized cylindrical surface,
   d. delaminating material from said generalized cylindrical workpiece surface along the subsurface layer of end-of-range ion damage, the delamination moving progressively around said workpiece and spiraling progressively deeper.

23. A method for preparing a sheet of crystalline or polycrystalline material comprising:
   a. providing a substantially cylindrical workpiece of crystalline or polycrystalline material,
   b. providing a wire saw, comprising an axially moving wire disposed with abrasive, said wire saw having a straight segment of its path substantially parallel to the cylindrical axis of said workpiece,
   c. rotating said workpiece about said cylindrical axis,
   d. moving said straight wire segment and said cylindrical axis gradually closer together,
whereby said workpiece is cut spirally, releasing a continuous sheet of crystalline material.

* * * * *